United States Patent
Hall et al.

(10) Patent No.: US 8,884,241 B2
(45) Date of Patent: Nov. 11, 2014

(54) INCIDENT CAPACITIVE SENSOR

(75) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/228,260

(22) Filed: Sep. 8, 2011

(65) Prior Publication Data

US 2013/0062529 A1    Mar. 14, 2013

(51) Int. Cl.

| H01L 31/0232 | (2014.01) |
|---|---|
| G01T 1/24 | (2006.01) |
| G01J 5/34 | (2006.01) |
| G01S 3/783 | (2006.01) |
| H01L 31/119 | (2006.01) |
| H01L 31/113 | (2006.01) |

(52) U.S. Cl.
CPC ........... *H01L 31/119* (2013.01); *G01T 1/24* (2013.01); *H01L 31/02327* (2013.01); *G01J 5/34* (2013.01); *G01S 3/783* (2013.01); *H01L 31/113* (2013.01)
USPC .................................................. 250/370.14

(58) Field of Classification Search
USPC .................................................. 250/370.14
See application file for complete search history.

(56) References Cited

U.S. PATENT DOCUMENTS

| 3,502,884 A | 3/1970 | Perlman et al. |
|---|---|---|
| 4,331,873 A | 5/1982 | Miller et al. |
| 4,388,532 A | 6/1983 | Garcia |
| 4,484,565 A | 11/1984 | Mori |
| 4,529,884 A * | 7/1985 | Wolicki et al. ........... 250/370.07 |
| 4,603,258 A | 7/1986 | Sher et al. |
| 4,742,813 A | 5/1988 | Riehl et al. |
| 4,804,832 A * | 2/1989 | Gardner .................... 250/206.1 |
| 5,043,582 A * | 8/1991 | Cox et al. ................. 250/370.09 |
| 5,825,840 A | 10/1998 | Anagnostopoulos |
| 6,040,592 A | 3/2000 | McDaniel et al. |
| 6,169,284 B1 | 1/2001 | Caputo et al. |
| 7,145,121 B1 | 12/2006 | Cook, Jr. |

(Continued)

FOREIGN PATENT DOCUMENTS

| DE | 102009029397 A1 | 3/2011 |
|---|---|---|
| WO | 87/03696 A1 | 6/1987 |

OTHER PUBLICATIONS

Wikipedia Definitions of Photmeter, Photoresistor, Photodiode, and Photomultiplier; 2 pgs; Downloaded by inventor and provided in a presentation dated to Sep. 7, 2010.

(Continued)

*Primary Examiner* — David Porta
*Assistant Examiner* — Shun Lee
(74) *Attorney, Agent, or Firm* — David G. Dolezal; Jonathan N. Geld

(57) ABSTRACT

A capacitive sensor device for measuring radiation. The device includes two sensor regions and top plate structure. The sensor regions are of a material that generates electron-hole pairs when radiation strikes the material. A separation region is located between the two sensor regions. The capacitance between a sensor region and top plate is dependent upon radiation striking the sensor region. A blocking structure selectively and differentially blocks radiation having a parameter value in a range from the sensor region so as to differentially impact electron-hole pair generation of one sensor region with respect to electron-hole pair generation of the other sensor region at selected angles of incidence of the radiation.

21 Claims, 8 Drawing Sheets

(56) References Cited

U.S. PATENT DOCUMENTS

| 7,977,240 | B1* | 7/2011 | Rockenberger et al. ...... 438/674 |
| 2001/0042879 | A1* | 11/2001 | Ghilardelli et al. ........... 257/296 |
| 2006/0268262 | A1 | 11/2006 | Maldziunas |
| 2007/0290284 | A1* | 12/2007 | Shaffer ......................... 257/432 |

OTHER PUBLICATIONS

Brownson; "Nanornech in Photovoltaics-Variations in ETA-Cell Models: Photocapacitors"; http://nanoparis.blogspot.com; Mar. 4, 2006; 4 pages (last page is blank).

Schmidt et al.; "Integrated photocapacitive position-sensitive detector made in CMOS technology"; Science Direct Sensors and Actuators A: Physical; Nov. 1993; 1 page Abstract; vol. 39; No. 2; Elsevier B.V.

Dume; "A new type of solar cell"; http://physicsworld.com; Nov. 4, 2004; 2 pgs (p. 2 blank); Physics World.

Illustration of sandwich photocapacitor; http://physicsworld.com; downloaded Mar. 22, 2011; 2 pgs (p. 2 blank); Physics World.

Van Zeghbroeck; "Metal-Oxide-Silicon Capacitors"; Principles of Electronic Devices; Dec. 2004; Table of Contents—7 Pgs &Chapter 6—25 Pages; ECEE, University of Colorado.

Sun, C., et al, "A New Semiconductor Device—The Gate-Controlled Photodiode: Device Concept and Experimental Results", IEEE Journal of Quantum Electronics, vol. 25, Issue 5, May 1989, pp. 896-903.

Chang, E. et al., "Wide Dynamic Range CMOS Active Pixel Sensor With Sensitivity Control Gate", Semiconductor Conference, Oct. 12-14, 2009, vol. 1, pp. 289-292.

U.S. Appl. No. 13/228,215, Hall, Mark D., "Capacative Sensor Radiation Measurement", Office Action—Rejection, May 27, 2014.

U.S. Appl. No. 13/228,215, Inventor Mark D. Hall, "Incident Capacitive Sensor", filed Sep. 8, 2011, Office Action—Notice of Allowance, mailed Sep. 12, 2014.

* cited by examiner

INCIDENT CAPACITIVE SENSOR

RELATED APPLICATION

This application is related to an application Ser. No. 13/228,215 entitled "Capacitive Sensor Radiation Measurement," having common inventors, having a common assignee, having a common filing date, all which is incorporated by reference in its entirety.

BACKGROUND OF THE INVENTION

1. Field of the Invention

This invention relates to capacitive sensors and particularly to incident capacitive sensors.

2. Description of the Related Art

A capacitive sensor is a sensor whose capacitance changes based upon the parameter being measured.

DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, an incident capacitive sensor device is disclosed that includes sensor regions wherein the capacitance due to each sensor region can be independently measured and used to determine parameters about the radiation passing through the windows. In some examples, a top plate or other structure would block (either partially or totally) radiation from the sensors depending upon the direction of the measured radiation. The radiation that affects the capacitance may be wavelength radiation in the visible range or in the non-visible range (e.g. UV, infrared, X-rays) or particle radiation (e.g. alpha particles or heavy ions). The capacitance measurements may be used to determine a component of the angle of incidence of the radiation.

Figure 1:
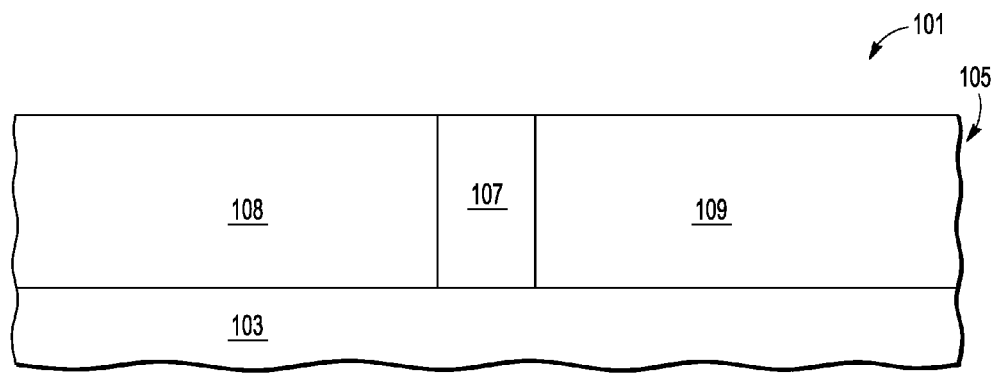
FIGS. 1-3 set forth partial cross sectional views of various stages in the manufacture of an incident capacitive sensor device according to one embodiment of the present invention.
Figure 2:
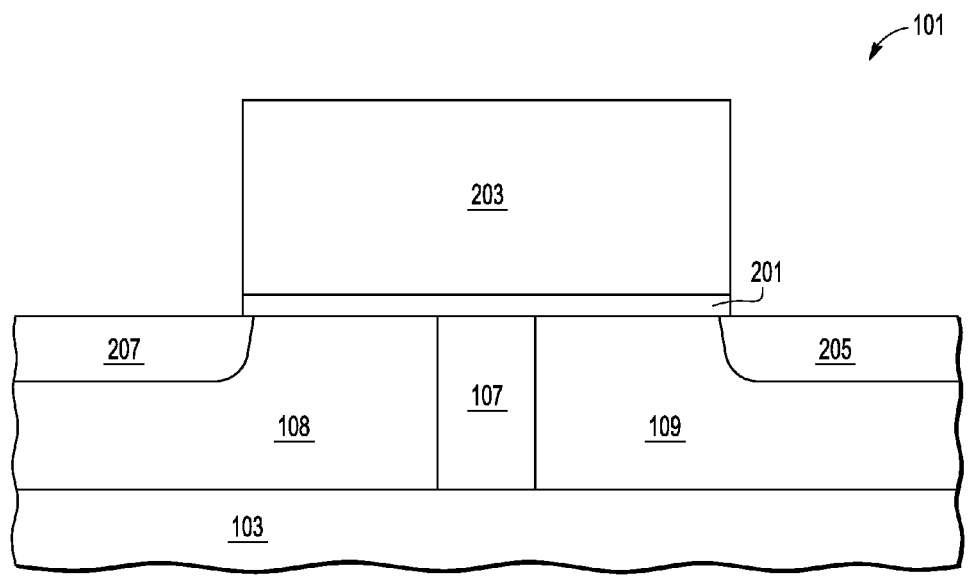
Figure 3:
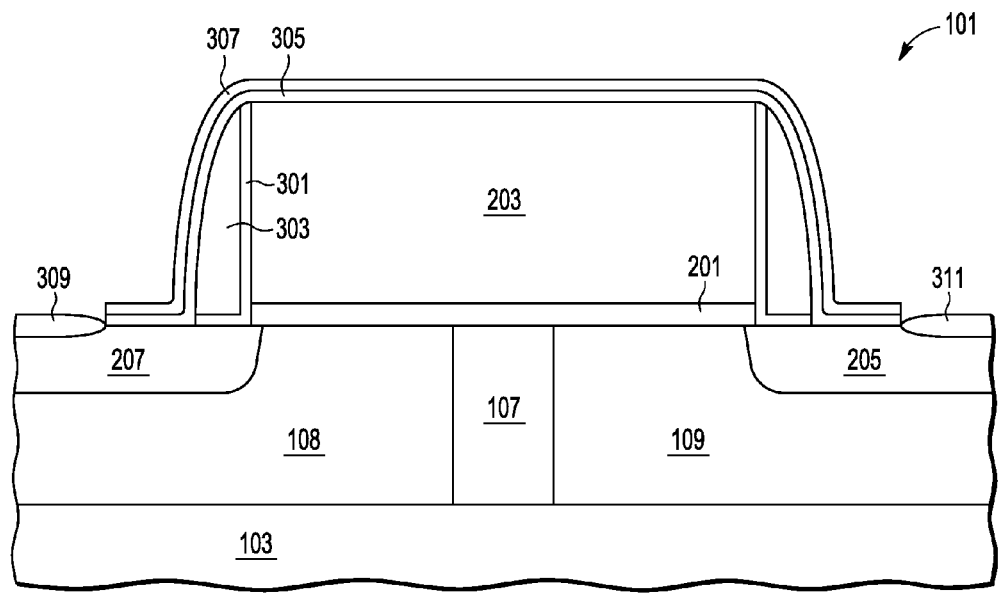

FIGS. 1-3 are partial cross sectional views of a capacitive sensor device at various stages in its manufacture. FIG. 1 is a partial cross sectional view of wafer 101. In the embodiment shown, wafer 101 includes a semiconductor on insulator (SOI) configuration with a semiconductor material layer 105 located over insulator layer 103. In one embodiment, layer 103 is made of silicon dioxide but may be made of other dielectrics in other embodiments. In some embodiments, layer 103 is located over a bulk substrate layer (e.g. silicon) (not shown). In other embodiments, wafer 101 may be a bulk wafer and insulator layer 103 is not present.

In one embodiment, layer 105 is made of monocrystalline silicon, but may be made of other semiconductor materials (e.g. silicon germanium, silicon carbide, gallium nitride, gallium arsenide, or other III-V semiconductor materials) or other types of materials. In the embodiment shown, layer 105 is lightly doped with conductivity dopants. In one embodiment, layer 105 is doped with a P-type dopant (e.g. Boron) having a concentration in the range of $10^{16}$-$10^{18}$ atoms per cm$^3$, but may be doped at other concentrations or with other impurities in other embodiments.

In some embodiments, layer 103 is formed by implanting ions into a substrate. In other embodiments, layer 105 is deposited on layer 103. In some embodiments, layer 105 is formed from a donor wafer (not shown).

In some embodiments, the type of material of layer 105 would depend upon the type of radiation being measured by the capacitive sensor. In some embodiments for measuring wavelength radiation, the material of layer 105 has a photon absorption cross-section for which photons at a desired wavelength radiation to be measured would be absorbed to generate electron-hole pairs. Listed in the table below are substrate materials and wavelength ranges at which incident radiation is absorbed in the substrate to generate hole electron pairs.

| Material type | Wave length range |
|---|---|
| Silicon | 190-1100 nm |
| Germanium | 400-1700 nm |
| Indium Gallium Arsenide | 800-2600 nm |
| Lead(II) Sulfide | <1000-3500 nm |

In some embodiments for measuring particle radiation, particles hitting a lattice of the material disrupt the lattice and transfer energy to the atoms of the material leading to electron-hole pair generation. In one embodiment, the type of material used has an absorption cross section that depends upon the particle size and/or particle energy of the radiation being measured. In some embodiments, the radiation may be above a certain threshold before any electron-hole pairs are generated.

Located in layer 105 is a separation region 107 for separating well region 108 of layer 105 from well region 109 of layer 105. Region 107 is made of a material that prevents the electrons of the electron-hole pairs generated by incident radiation striking the well region from migrating to the other well region. In the embodiment shown, region 107 extends from the top of layer 105 to the top of layer 103. In one embodiment, region 107 is made of a material that has a higher conductivity dopant concentration than the remaining portions of layer 105. In one such example, region 107 is formed by forming a protective oxide layer (not shown) over layer 105, forming a layer of photo resist (not shown) over the protective oxide layer, forming an opening in the photo resist at the location of region 107, and then implanting region 107 with a heavier concentration of conductivity dopants (e.g. $10^{19}$-$10^{21}$ cm$^3$) that are of the same conductivity type as used to dope layer 105. Afterwards, the photo resist and oxide layer are removed.

Region 107 may be formed by different methods and/or made of different materials in other embodiments. For example, region 107 may be made of silicon dioxide or other dielectric material. In one embodiment, an opening would be formed in layer 105 followed by the formation of a dielectric material over wafer 101 (either by oxidation and/or deposition). The wafer would then be planarized to leave the structure as shown in FIG. 1.

FIG. 2 is a partial cross sectional view of wafer 101 at another stage in its manufacture. FIG. 2 shows wafer 101 after a top plate 203 and dielectric 201 are formed over wafer 101. In one embodiment, dielectric 201 is made of silicon dioxide and has a thickness of 20-200 Angstroms, but may have other thicknesses and/or may be made of other materials (e.g. a high K dielectric or other type of dielectric) in other embodiments.

In one embodiment, top plate 203 is made of a conductive material (e.g. doped polysilicon, tungsten, aluminum, other metals, or layers of different conductive materials). In one embodiment, top plate 203 has a thickness of 800 to 1000 Angstroms, but may be of other thickness in other embodiments. Top plate 203 and dielectric 201 may be formed by forming layers of those materials over wafer 101 followed by a subsequent patterning of those materials. In some embodiments, dielectric 201 may be patterned to form a gate dielectric for transistors built on other parts of the wafer, and the layer for forming plate 203 can be patterned to form gates for those transistors. Plate 203 will be used as an electrode and dielectric 201 will be used as a dielectric for a capacitor.

After forming top plate 203 and dielectric 201, connection regions 205 and 207 are formed in layer 105 by implanting ions into those regions. In the embodiment shown, the dopants implanted into connection regions 205 and 207 are of the opposite conductivity type of those implanted into well regions 108 and 109. In an embodiment where P type dopants are implanted into layer 105, regions 205 and 207 are implanted with N-type dopants (e.g. arsenic, phosphorus) at a concentration of $10^{19}$-$10^{21}$ atoms per cm$^3$, or at other concentrations in other embodiments. Regions 205 and 207 have a depth (e.g. 30-1000 nm) that is less than the thickness of layer 105, but may have other depths in other embodiments. After implantation, the implanted dopants are annealed where the dopants diffuse under top plate 203. In other embodiments, the dopants would be implanted at an angle to be driven under top plate 203. In one embodiment, lightly doped extensions of the same conductivity type of dopants may be formed prior to the implantation of regions 205 and 207.

FIG. 3 shows wafer 101 after the formation of spacers 303 and 301 and the formation of silicide structures 309 and 311. In the embodiment shown, spacer 301 is made of a thin oxide liner and spacer 303 is made of nitride. Spacers 301 and 303 are formed by forming a layer of oxide and then a layer nitride over wafer 101 and then anisotropically etching the layers to leave the spacers.

After the anisotropic etching, oxide layer 305 and nitride layer 307 are formed over wafer 101 and then etched to define openings to expose the connection regions 205 and 207. Silicide structures 309 and 311 are then formed on the exposed portions of those connection regions. In one embodiment, silicide structures 309 and 311 are formed by forming a layer of metal (e.g. titanium, nickel, or cobalt) over wafer 101 and heating the wafer to form the silicide. The unreacted metal is then removed. Forming layers 307 and 305 and then patterning them to form openings for the silicide structures allows for the silicide structures to be located further away from top plate 203. Afterwards, layers 307 and 305 would be removed. In other embodiments, spacers 301 and 303 would not be formed. Also in other embodiments, layers 305 and 307 would not be removed.

In other embodiments, other spacers would be formed (by an anisotropic etching process) adjacent to spacers 301 and 303 to provide further separation between silicide structures 309 and 311 and top plate 203 (as opposed to or in addition to forming layers 307 and 305). Also in one embodiment, an opening would be formed in layers 307 and 305 to expose the top portion of top plate 203 for forming a silicide structure on top plate 203.

Figure 4:
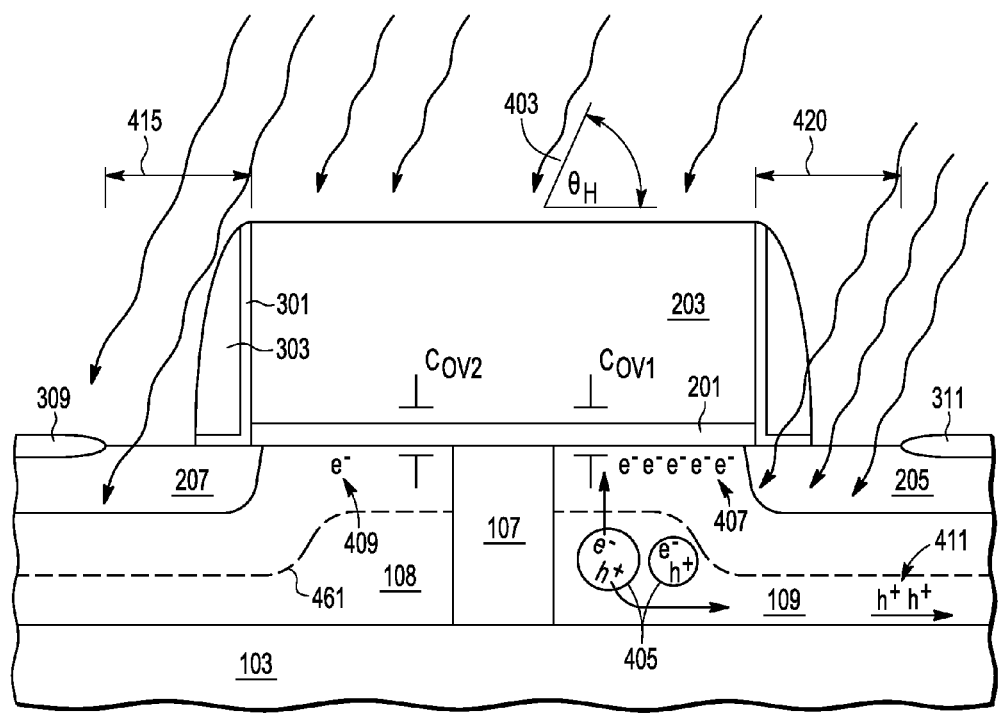
FIG. 4 sets forth a partial cross sectional view of an incident capacitive sensor device according to one embodiment of the present invention.

FIG. 4 shows a view of a capacitive sensor device. In the embodiment of FIG. 4, layers 305 and 307 have been removed. After the removal of layers 305 and 307, electrical interconnects, electrical vias, and interlayer dielectric layers (not shown) are formed over wafer 101. The interconnects and vias are electrically coupled to structures 309, 311, and top plate 203 to electrically couple those structures to other electrical circuits for applying voltages and measuring voltages. These other circuits may be formed on the same wafer as the sensor device or may be formed on separate wafers and later electrically coupled. Also not shown in FIG. 4 are dielectric and passivation layers that are located over windows 415 and 420 and top plate 203. These materials provide insulation for the electrical interconnects of the interconnect layers as well as physical protection of the sensor device. The dielectric and passivation materials located at least over the sensor device are translucent with respect to the type of radiation being measured.

After the processing of wafer 101 is completed, the wafer is singulated into individual die with each die including at least one sensor device shown in FIG. 4.

FIG. 4 shows radiation incident upon the sensor device at an incident horizontal angle $\Theta_H$ 403 with respect to the planar surface of layer 105. In the embodiment shown, top plate 203, silicide structure 309, and silicide structure 311 have a thickness and are of a material that does not allow the radiation being measured to pass through to layer 105. The space between top plate 203 and structure 309 defines a first window 415 for one capacitive sensor and the space between top plate 203 and structure 311 defines another window 420 for the other capacitive sensor. In the embodiment shown, the spacer material (silicon oxide and silicon nitride) of spacers 301 and 303 would allow radiation being measured to pass through. In some embodiments, the material of structures 309 and 311 is of a material and thickness to allow the measured radiation to pass through. With such embodiments, the width of the windows would be larger.

Well regions 108 and 109 act as capacitive sensor regions. Depending upon the type of material of layer 105, when radiation strikes layer 105, electron-hole pairs 405 form in well regions 108 and 109. The number of electron-hole pairs that form in a well depends upon the amount of radiation passing through each window associated with the well. When a voltage is applied to top plate 203, the electrons of the electron-hole pairs formed from the radiation are pulled to the top of layer 105 underneath top plate 203 to form a negative charge (an inversion layer) 407 (and 409) at the top of layer 105. This area of negative charge 407 acts as an electrode of a capacitor with top plate 203 acting as the other electrode. In FIG. 4, this capacitance for well region 109 is represented by capacitor symbol $C_{ov1}$ and for well region 108 is represented by capacitor symbol $C_{ov2}$. In other embodiments, a capacitive sensor region may be implemented by other structures in other embodiments.

The capacitance generated by the radiation passing through a window is dependent upon the amount and energy of the radiation passing through the window to generate electron-hole pairs. The more pairs generated, the greater the number of electrons at the top of the well, and thus the greater the measured capacitance. The holes generated would be drawn to a contact to layer 105 (not shown but in the direction of arrow 411 for well region 109). The capacitance $C_{ov2}$ is measured between top plate 203 and silicide structure 309 which contacts connection region 207. The capacitance $C_{ov1}$ is measured between top plate 203 and silicide structure 311 which contacts connection region 205. The inversion region formed by the electrons of the negative charge 407 at the top of well region 109 is electrically coupled to connection region 205, thereby allowing for a capacitance measurement of the inversion layer electrode with respect to top plate 203. Likewise, the inversion region formed by electrons 409 is electrically coupled to connection region 207 to allow for a capacitance measurement of the inversion layer electrode with respect to top plate 203. Line 461 in FIG. 4 defines the bottom part of the depletion region formed when a positive voltage is applied to top plate 203.

In the embodiment shown, if there were no radiation striking through windows 415 and 420, then the capacitance value measured between top plate 203 and silicide structure 309 and the capacitance value measured between top plate 203 and silicide structure 311 would be at a lower value than if incident radiation were passing through the windows. So as the amount and energy of the radiation passing through a window increases, the electron concentration at the surface of layer 105 increases and accordingly, the capacitances $C_{ov2}$ and $C_{ov1}$ increase as well.

Because top plate 203 is made of a blocking material that does not allow the measured radiation to pass through, radiation from a non perpendicular direction will be partially blocked from at least one of windows 415 and 420, depending upon the angle of incidence at which the radiation enters a window. For example, if the radiation is coming from the right side of FIG. 4, the horizontal angle ($\Theta_H$) will be less than 90 degrees. With such an angle of incidence, window 420 will receive more radiation than window 415 because top plate 203 will be blocking some of the radiation. If the radiation were coming from an opposite direction at the same horizontal angle, then window 415 would receive more radiation than window 420.

Accordingly, depending upon the angle of incidence, capacitance Cov2 or capacitance Cov1 will have a higher capacitance value. If $\Theta_H$ (as shown in the drawing) is 90 degrees, then $C_{ov2}$ will equal $C_{ov1}$. Thus, by measuring the difference in capacitance between $C_{ov2}$ and $C_{ov1}$, a value for $\Theta_H$ can be determined for certain incident angles.

In other embodiments, a capacitive sensor device may be made on a substrate of a bulk semiconductor material. In such an embodiment, a layer of the substrate at the location of layer 103 may be heavily doped with the opposite conductivity dopant (e.g. N+ type) as the dopants of well regions 108 and 109. The dopant in layer 103 would be of an opposite type to the dopant in well regions 108 and 109 so that layer 103 provides junction isolation. Also in other embodiments, the conductivity dopants may be switched. For example, layer 105 may be doped with N-type dopants and regions 205 and 207 would be doped with P-type dopants. For N-type doped wells, capacitive plate (at the location of charge 407) would be made of holes.

In another embodiment, the top plate would have an interior opening that would be located to expose portions of at least two different well regions. The well regions would be separated by a separation region, at least a portion of which would be exposed by the opening. Radiation would strike the portions of the exposed well regions through the opening. The connection regions would be formed on the outside of the top plate. The capacitance of each well region within the opening of the plate would be measured to determine the incident angle of radiation striking through the interior opening to the well regions.

Figure 9:
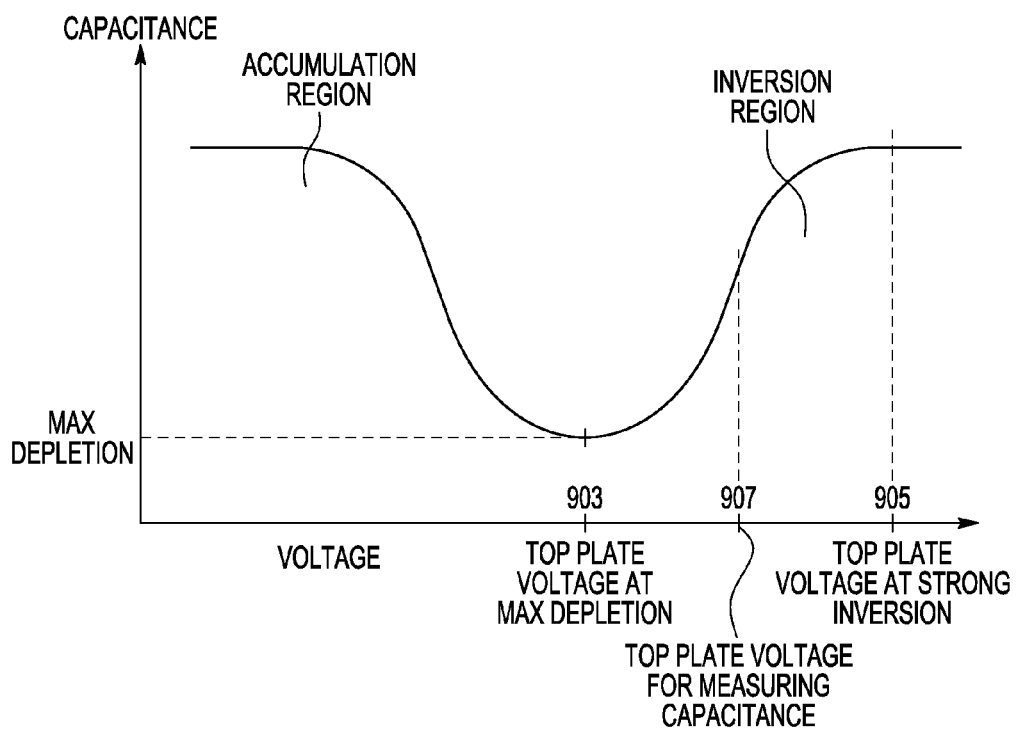
FIG. 9 is a graph setting forth various possible voltage values to apply to a plate of a capacitor according to one embodiment of the present invention.

FIG. 9 is a graph illustrating the desired operating region of the top plate voltage (the voltage applied to top plate 203) for measuring capacitance due to incident radiation striking a well region though a window. In the graph of FIG. 9, the Y axis represents the capacitance as measured between a connection region (e.g. 205) and top plate (203). The X axis represents the voltage applied to a top plate (e.g. 203).

As shown in the graph, when the top plate voltage is at an initial low voltage, the measured capacitance is at a relatively high value due to a minimal depletion depth (461 in FIG. 4) generated in the well region. As the top plate voltage is increased, the depletion region depth increases until it reaches a maximum depth when the voltage is at point 903. As the top plate voltage is further increased, the measured capacitance increases due to the formation of the inversion layer at the top of the well underneath the top plate (see charge 407). As the voltage is further increased, the inversion layer becomes more dense until the inversion layer saturates (e.g. when the top plate voltage is at point 905). At this point, the capacitance will not increase further with an increase in the top plate voltage or with an increase in incident radiation striking the well through the window.

Accordingly, it is desirable that the voltage applied to the top plate for measuring the capacitance due to incident radiation be a voltage value that provides for the maximum change in measured capacitance due to a change in radiation. In some embodiments, that top plate voltage for measuring capacitance is between the voltage at point 903 and the voltage at point 905. One example is the voltage at point 907. The optimum voltage used would depend on such factors as dielectric thickness, dielectric material type, top plate material type, size of window, the doping concentration of well regions 108 and 109, the doping concentration of connection regions 205 and 207, the voltage applied at well regions 108 and 109 and at connection regions 205 and 207, the transparency of any materials located in the window, the desired range of measured radiation sensitivity, and the type of radiation measured.

Figure 5:
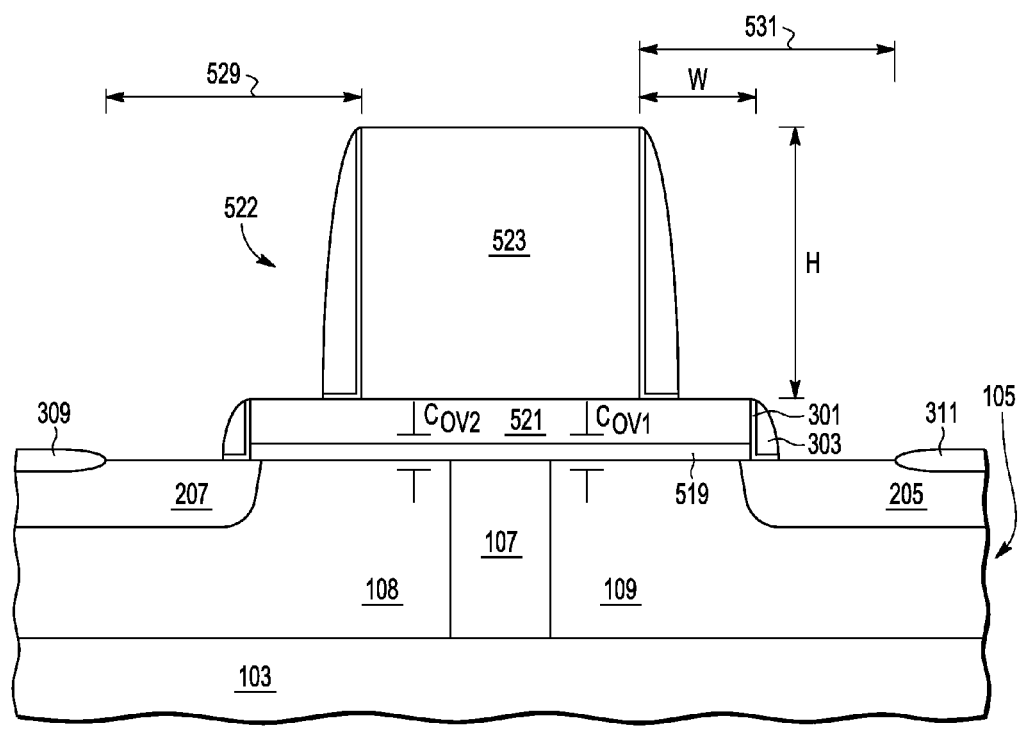
FIG. 5 is a partial cross sectional view of an incident capacitive sensor device according to one embodiment of the present invention.

FIG. 5 shows another embodiment of a capacitive sensor device according to the present invention. The embodiment of FIG. 5 is similar to the embodiment of FIG. 4 except that top plate structure 522 has an inverted T shape. Otherwise, those structures that are similar to corresponding structures of FIG. 4 have the same reference numbers.

In the embodiment of FIG. 5, top portion 523 of structure 522 is of a height and material that does not allow the wavelength radiation being measured to penetrate to layer 105. However, the bottom portion 521 of the top plate structure is of a height and material that does allow the radiation being measured to pass through to layer 105. In one embodiment, portion 521 is made of polysilicon and is sufficiently thin (e.g. 100-300 Angstroms) to allow the measured radiation to pass through to layer 105. In other embodiments, portion 521 is made of tantalum nitride or tungsten nitride which is etch selective with respect to the material of the top portion 523. In one embodiment, the material of portion 523 is made of polysilicon or a metal with a sufficient thickness to prevent radiation penetration. In one example where portion 523 is made of polysilicon, portion 523 has a thickness (shown as dimension "H" in FIG. 5) of 800-10000 Angstroms, but may be of other thicknesses in other embodiments.

By making portion 521 so that radiation can pass, the location of the window 529 and 531 can be moved at least partially under the top plate structure 522, as shown by the dimension "W" in FIG. 5. This acts to increase the signal strength of the measured capacitance in that the generated electron-hole pairs are denser under the top plate structure, and in particular, under portion W of the top plate structure. In such an embodiment, the electron-hole pair density increase results in a more sensitive device.

The difference ratio of the widths of the windows 529 and 531 versus the height "H" of the top portion 523 can be set to adjust the resolution within a particular range to measure the horizontal angle. For example, if the thickness of the blocking portion 523 (as indicated by the "H" dimension) is relatively greater than the width of a window, then the capacitive sensor device in FIG. 5 will be able to provide a better resolution of horizontal angles that are closer to 90 degrees. This is due to the relatively "tall" top portion 523 significantly blocking a window (either 529 or 531) as the horizontal angle of incidence moves from 90 degrees. In other embodiments, portion 523 can be made relatively shorter with respect to the window width to be able to provide a wider range of horizontal angle measurement.

In one embodiment, the resultant top plate structure can be formed by patterning a layer (e.g. of polysilicon) with a photo resist pattern (or hard mask pattern patterned by a photo resist pattern) having a width of portion 523. The timed etch leaves a portion of the layer having a thickness of portion 521 outside of the pattern. Afterwards, a sacrificial spacer (not shown) is formed on the side of top portion 523. The spacer has a width of W. Afterwards, the layer is subject to an anisotropic etch to remove the remaining portions of the lower layer. If the spacer is translucent to the radiation being measured, then the spacer does not have to be removed.

In other embodiments, portions 523 and 521 can be made of different materials. In one embodiment, the two layers of different materials would be formed over wafer 101. Portion 523 would be patterned first, followed by the formation of a sacrificial spacer around portion 523. Portion 523 and spacer would be used as an etch mask to form portion 521 by an anisotropic etch. In other embodiments, top portion 523 and bottom portion 521 are formed with different photo resist mask patterns. However, using sacrificial spacers located on the side of portion 523 is preferable in that the alignment challenge of two mask patterns can be avoided.

In another embodiment, portion 523 may not be electrically conductive or may not be electrically coupled to portion 521. In such an embodiment, portion 521 is the top plate of the sensor. With such an embodiment, portion 521 would extend out further to an area (located into or out of the page) than portion 523 so that a contact can be formed to portion 521.

Also in other embodiments, dielectric 519 has a dielectric constant to provide a sufficient capacitance to the capacitor formed with portion 521 and the electrons located at the top of layer 105 when incident radiation strikes layer 105.

In other embodiments, silicide structures 311 and 309 may be located a greater distance or lesser distance from spacer 301. In some embodiments, silicide structures 309 and 311 extend to spacers 301.

Figure 6:
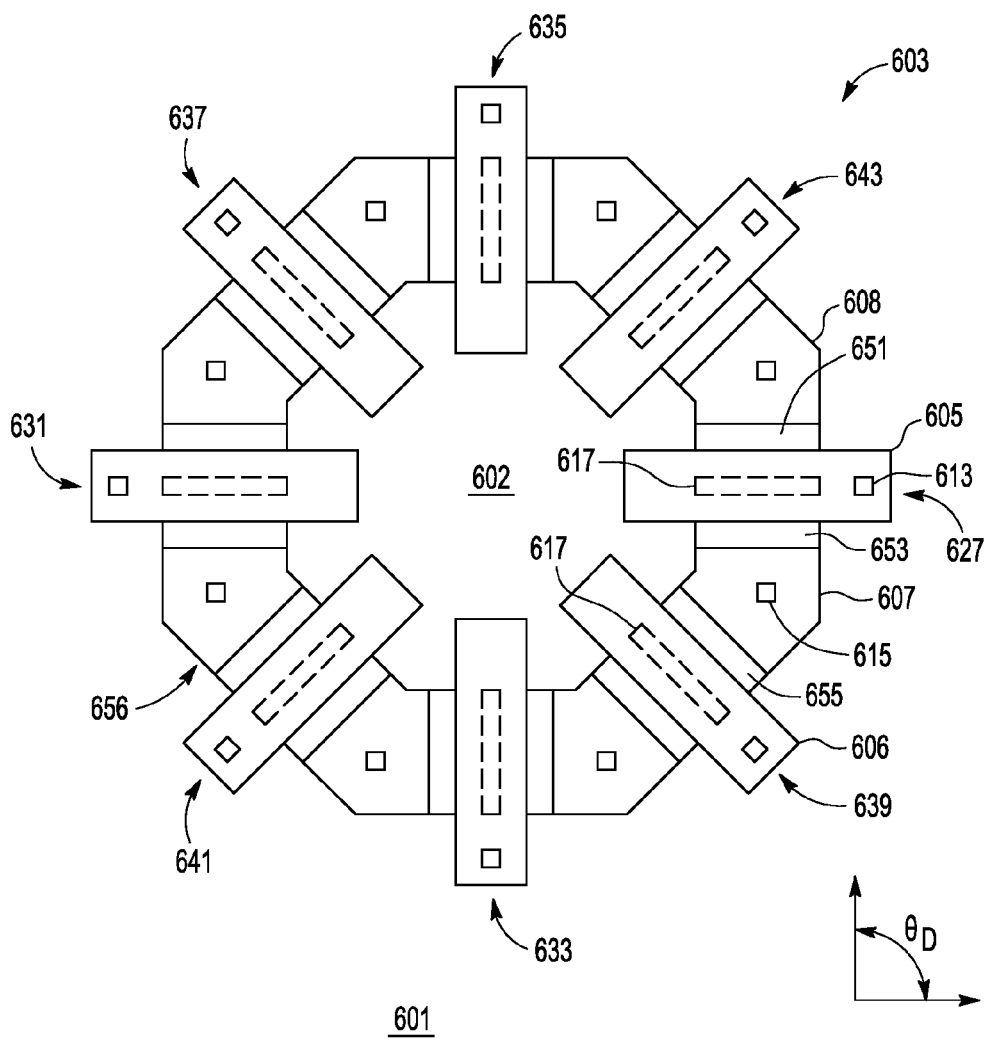
FIG. 6 is a top view of a sensor array according to one embodiment of the present invention.

FIG. 6 shows a top view of an array 603 of sensor cells according to one embodiment of the present invention. Array 603 includes a number of sensor cells (635, 643, 627, 639, 633, 641, 631, and 637) formed on substrate 601. The cells are oriented in different positions to allow array 603 to measure a directional angle ($\Theta_D$) and a horizontal angle ($\Theta_H$) of radiation of the incident angle of the radiation. The horizontal angle $\Theta_H$ is the angle of radiation as measured with respect to the planar surface of substrate 601. The directional angle ($\Theta_D$) is the angle of radiation as measured from the 12 o'clock direction as shown in FIG. 6. For example, referring to FIG. 6, radiation coming from the top of the page (12 o'clock) would have a 0 degree directional angle ($\Theta_D$). Radiation coming from the bottom of the page (6 o'clock) would have a 180 degree directional angle ($\Theta_D$). Incident radiation coming from a particular direction has both a directional angle $\Theta_D$ component and a horizontal angle $\Theta_H$ component.

In the embodiment shown, each sensor cell (e.g. 635) is similar to the sensor device of FIG. 4. Regarding sensor cell 627, top plate 605 is similar to top plate 203, silicide structure 607 is similar to silicide structure 309, silicide structure 608 is similar to silicide structure 311, and separation region 617 (shown in dashed lines) is similar to separation region 107. In the embodiment shown, window 651 is similar to window 420 and window 653 is similar to window 415. In one embodiment, the well regions (e.g. 108 and 109) are located in substrate 601 under the silicide portions and in the area of the windows. The well regions of array 603 form the segments of a ring (or other closed loop structure in other embodiments) separated by the isolation regions (e.g. 617) as shown in FIG. 6. Substrate 601 includes a dielectric material 602 that both surrounds the well regions and is located inside the well regions for electrical isolation of the well regions. In the embodiment, the ring structure has sides formed by the capacitive sensor well regions where the separation regions (e.g. 617) are positioned orthogonal to the positions of the sides of the rings.

Array 603 includes a number of top plate contacts (613) and silicide structure contacts (615) for providing electrical contact to measure capacitances at various points in the sensor array 603. The contacts are electrically coupled to electrical interconnects (not shown) that are formed over substrate 601 and array 603. The interconnects are located in dielectric material (not shown) also formed above substrate 601 and array 603.

With the embodiment shown, each silicide contact 615 is used to measure a capacitance for two well regions. For example, contact 615 is used to measure the capacitance from the well region of window 653 (as indicated by the difference in capacitance between top plate 605 and silicide structure 607) and used to measure the capacitance of the well region of window 655 (as indicated by the difference in capacitance from silicide structure 607 and top plate 606). Thus in the embodiment shown, each capacitive sensor shares a connection region and well region with an adjacent sensor.

In one embodiment, the array includes a body contact (not shown) for attracting holes formed from radiation striking the well regions. In some embodiments where the sensor array is implemented on an SOI substrate, each sensor region would include a body tie. However, in other embodiments implemented on an SOI substrate, the array may include a single well tie.

The sensor cells are positioned at different directional angles so as to be able to measure the directional angle ($\Theta_D$) of radiation. For example, if the incoming radiation has a directional angle ($\Theta_D$) of 0 degrees (coming from the top of the page) or a directional angle of 180 degrees (coming from the bottom of the page), cells 631 and 627 will show the largest difference in capacitance between their two windows. This is because the top plate structures (e.g. 605) block either one of the two windows adjacent to the top plate structure from receiving the full amount of radiation. For example, if the directional angle is 180 degrees (radiation coming from the bottom of the page), then plate 605 would block (or at least partially block) the radiation from passing through window 651, whereas window 653 would not be blocked. Thus, the difference in capacitance readings between top plate 605 and silicide structure 607 and between top plate 605 and silicide structure 608, along with the relative capacitive readings of the other sensors, would indicate that the directional angle is 180 degrees.

Cells 635 and 633 will show the largest difference in capacitance for the directional angle of radiation at 270 degrees (from the left of the page) or 90 degrees (from the right of the page). Cells 637 and 633 will show the largest difference in capacitance for the directional angle of radiation at 45 degrees and 225 degrees. Cells 643 and 641 will show the largest difference in capacitance for the directional angle of radiation at 135 degrees or 315 degrees.

As described above, the cell pairs are positioned to provide the largest difference in capacitance for the directional angle of radiation at angles of 0, 45, 90, 135, 180, 225, 270 and 315 degrees. Furthermore, the capacitance measurements of each sensor cell can be compared to determine the directional angles and horizontal angles located between those values.

In one example, to make determination of a directional angle of radiation, measurements would be made from each cell to determine which cells provide the greatest differential capacitance between wells of the cell. For example, if cells 631 and 627 provide the greatest differential, then directional angle would most likely be close to 0 or 180 degrees depending upon whether window 651 (indicating 0 degrees) or window 653 (indicating 180 degrees) has the greater measurement. The measurements of cell pair 637 and 633 and cell pair 643 and 641 (and also cell pair 635 and 633) may be used to determine whether the directional angle is greater than 180 degrees or less than 180 degrees. For example, if cell pair 641 and 643 provide a greater capacitance differential than cell pair 633 and 637, then the directional angle is less than 180 degrees. However, if cell pair 633 and 637 provide a greater capacitance differential, then the directional angle is greater than 180 degrees. If the capacitance differential between the adjacent cell pairs (pair 633 and 637 and pair 641 and 643) is the same, then the directional angle is exactly 180 degrees. Accordingly, by measuring and comparing the capacitive differences between each cell of the array, an accurate estimate for the directional angle of radiation can be determined.

With the angle of direction determined, the horizontal angle can also be determined based on the actual capacitive differences between the cells. For example, if the cells of the maximum capacitive difference have small capacitance differentials, then the horizontal angle is close to 90 degrees. If the maximum differences are great, then the horizontal angle would be closer to 0 degrees.

The dose of the radiation at a single point in time can be measured by adding the total capacitive measurement of all cells of the array at a single point in time or nearly at the same time. The greater the total measurement, the greater the dose of the radiation. In some embodiments, the horizontal angle may be used in the calculation of dose to compensate for angles with a low horizontal value (e.g. near zero). The dose can be integrated over time to measure a cumulative dose.

In the embodiment shown, array 603 has redundant cells for each angle. For example, cells 635 and 633 are positioned in a line at the 0 degree directional angle. Providing an array with redundant cells positioned at the same directional angle provides for a more accurate system that can tolerate manufacturing defects. However, in other embodiments, other arrays do not include redundant cells.

In some embodiments, the top plates of the redundant cells are electrically coupled (e.g. by electrical interconnects (not shown)) so that one measurement can be made that reflects the capacitance of both cells. For example, the top plates of cells 635 and 633 would be electrically coupled together. In such embodiments, the silicide structures on the opposite sides of the ring would also be electrically coupled together. For example, silicide structure 608 would be electrically coupled to silicide structure 656 in order to measure the combined capacitance of cell pairs 641 and 643 and cell pairs 631 and 627. In other embodiments, an array may include a greater number (more than two) of redundant cells.

In FIG. 6, the cells are shown located in a ring where silicide structures and well regions are shared among adjacent cells. However, in other embodiments, the wells and silicide structures of an array may be isolated from each other (e.g. with a dielectric material or a heavy dosage of implanted conductivity impurities) that prevent electrons from migrating between well regions.

Other arrays may include a different number of cells and/or may be positioned at different angles with respect to each other, for example, an array may include more sensor cells located in a ring (or in another configuration) to provide a better resolution of the directional radiation angle ($\Theta_D$) measurement. However, an array may include a lesser number e.g. 2 cells where the top plate of one sensor cell is oriented 90 degrees from the top plate of the other sensor cell. In another embodiment, an array includes 3 cells where the top plates would be oriented at 120 degrees from each other.

In other embodiments, the cells of an array may be located in a different configuration other than a ring. For example, the cells positioned at each directional angle on the array may be located in a row or column of an array, with cells oriented at other angles located in different rows or columns of a substrate.

In other embodiments, the windows and top plates may have different shapes other than that shown in FIG. 6. For example, the windows and/or top plates may have circle, oval, square, or other shapes that may be designed to maximize the capacitive difference obtained for a particular incident angle or range of incident angles. Also in some embodiments, the top plate may block more than one directional angle to a window. Also, the dimensions of a window with respect to a top plate may be different in other embodiments.

In other embodiments, the cells in the array may have different top plate heights, window sizes, and/or window positions with respect to other cells in the array to provide for different resolutions of angle measurements within an array. For example, top plate 605 of cell 627 may be taller than top plate of cell 631 so that cell 627 can provide a better resolution of the horizontal angles closer to 90 degrees and cell 631 can provide a better resolution at horizontal angles closer to 0 degrees.

Figure 11:
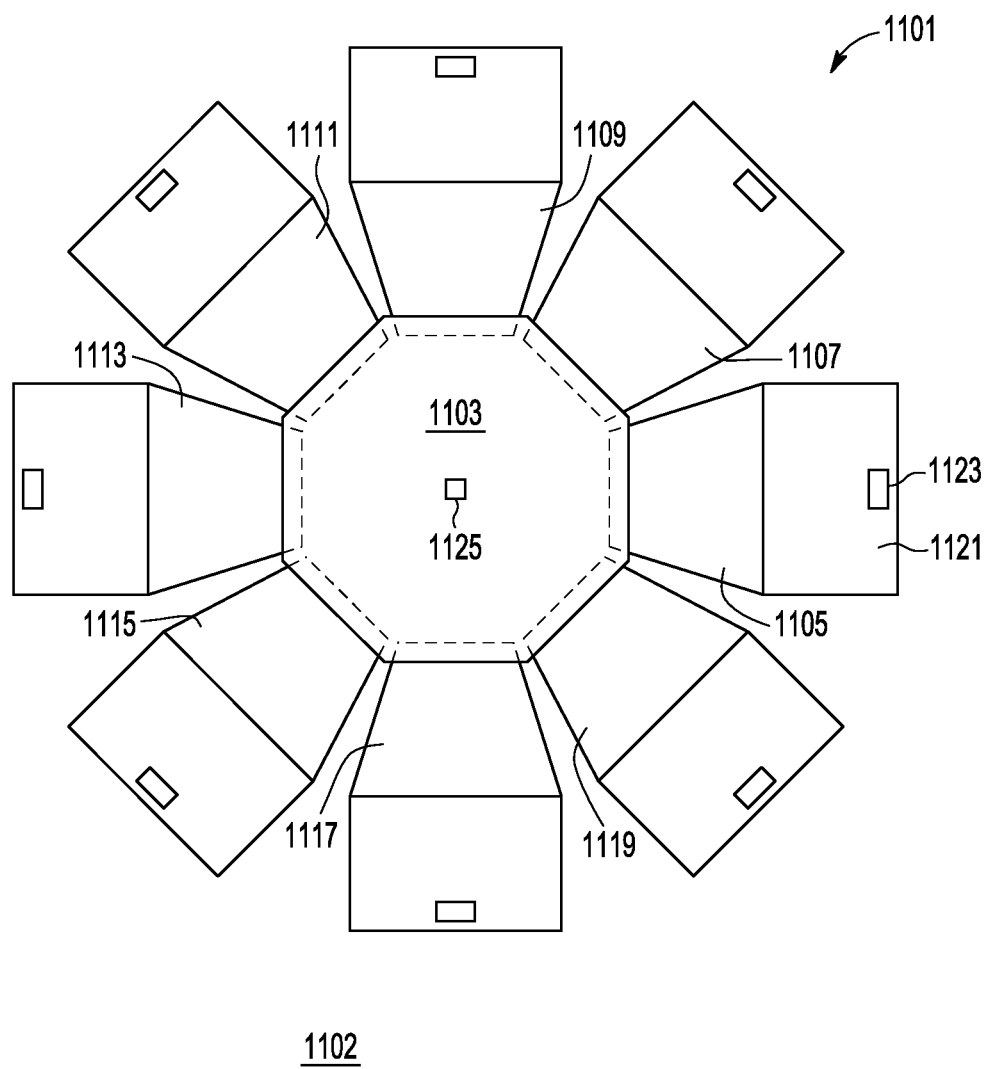
FIG. 11 is a top view of a sensor array according to one embodiment of the present invention.

In some embodiments, a cell would include greater number than two regions that surround a single top plate structure. For example, FIG. 11 shows a top view of a sensor array 1101 that includes 8 well regions (1105, 1107, 1109, 1111, 1113, 1115, 1117, and 1119) located in substrate 1102 which surround top plate 1103. Each well region is associated with a silicide structure (e.g. 1121) that is used to obtain capacitive measurements between the well region and top plate 1103. A contact (e.g. 1123) is formed on each silicide structure (1121) for electrically coupling the silicide structure to capacitance measuring circuitry via electrical interconnects (not shown). Top plate 1103 includes a contact 1125 for electrical coupling to capacitance measuring circuitry (not shown) via an interconnect (not shown). Not shown in FIG. 11 are the dielectric layers located over array 1101. Also not shown in FIG. 11 is at least one well tie for attracting holes formed from radiation striking the well regions.

In some embodiments, multiple interconnects from contact 1125 would traverse in equal distant directions from the center of top plate 1103 so as to affect equally the shading on each region due to the top plate interconnects. Also in other embodiments, a conductive via may be formed from top plate 1103 though substrate 1102 to the back side of substrate 1102 for electrically coupling top plate 1103.

In one embodiment, capacitive measuring circuitry sequentially measures the capacitance between each well region of array 1101 and top plate 1103. The directional and horizontal angles of incident radiation can be determined by the differences in capacitive readings of the different well regions and top plate 1103. The regions on the opposite side of top plate 1103 from the directional angle of incoming radiation will provide the lowest capacitive readings due to top plate 1103 shading those regions.

In other embodiments, the well regions, silicide structures and top plate may have different sizes and/or shapes other than that shown in FIG. 11. Also, array 1101 may contain a different number of wells other than what is shown in FIG. 11. Further in other embodiments, the top plate structure may have a number of electrically isolated conductive structures which serve as the top plate structures for the different well regions. In one such embodiment, each well region would have its own electrically conductive top plate structure.

Figure 7:
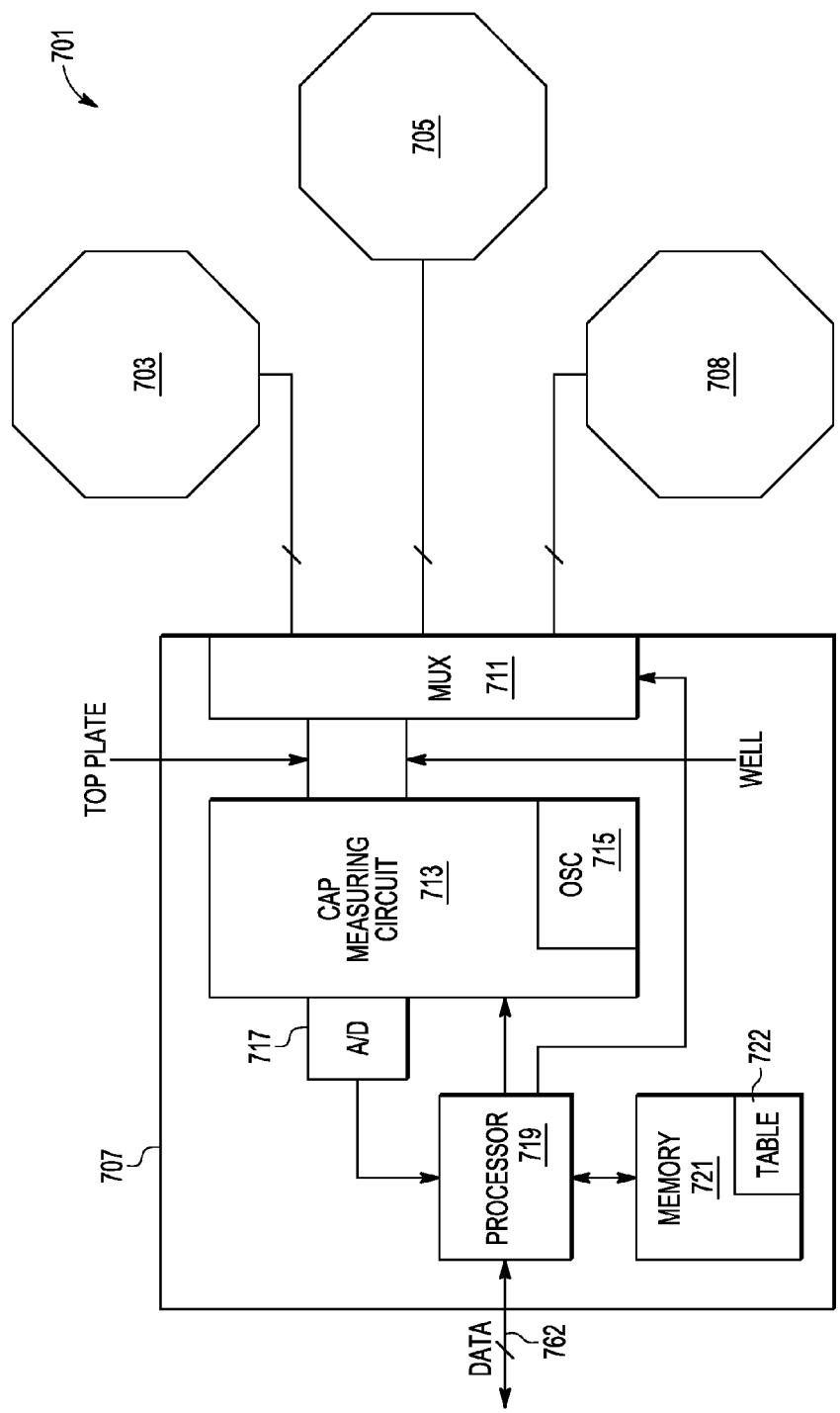
FIG. 7 is a circuit diagram of a sensor system according to one embodiment of the present invention.

FIG. 7 is a circuit diagram of a system 701 for measuring a directional angle, a horizontal angle, and the dose of radiation. System 701 includes sensor arrays 703, 705, and 708. In one embodiment, each array of system 701 is similar to array 603 or to sensor array 1101. In one embodiment, each sensor array is tuned to measure wavelength radiation of a different wavelength range. In some embodiments, each array may be tuned to measure a different type of particle radiation. For example in one embodiment, sensor array 703 is designed to measure radiation having a wavelength in the range of 100-1000 nm, sensor array 705 is designed to measure radiation having a wavelength in the range of 1000-2000 nm, and sensor array 708 is designed to measure radiation having a wavelength in the range of 2000-3000 nm. To measure radiation of different wavelengths, the sensor arrays may have sensor regions of different materials and/or may have overlying dielectric materials that filter radiation of different wavelengths. In some embodiments, the sensor arrays may measure different ranges of horizontal angles or different ranges of directional angles. In some embodiments system 701 includes only one array. In some embodiments, the arrays may have only one sensor.

In one embodiment, one of the sensor arrays is covered so that no radiation affects its capacitance values. Such an array is used to provide reference capacitance values to compare to the capacitance values measured from the other sensor arrays.

System 701 includes circuitry 707 for measuring the capacitances of the sensors of the arrays and using the measured capacitances to calculate the horizontal angle, directional angle, and dose of radiation. Circuitry 707 (needs a new number) includes a multiplexer 711 that has inputs coupled to each top plate and each well connection region of each array. Multiplexer 711 includes two inputs to couple the top plate and well connection region being measured to capacitance measuring circuit 713 to measure the capacitance of the sensor. In one embodiment, each sensor (top plate-well connection region combination) is coupled to circuit 713 sequentially to determine the capacitance values for the top plate-well connection region (or in some embodiments where redundant structures are tied together to measure the total capacitance values of the redundant structures). In other embodiments, each cell array 703, 705, and 708 would be associated with its own capacitive measuring circuit. Still in other embodiments, each sensor would be associated with its own capacitive measuring circuit. In one embodiment including the array of FIG. 11, top plate 1103 would be coupled to circuit 713 without using a multiplexer.

In the embodiment shown, circuit 713 includes an oscillator 715 for providing a signal at a predetermined frequency to the top plate or the well connection region of the capacitive sensor being measured to determine the capacitance. In one embodiment, DC current is applied to the top plate/well connection region combination where the rate of change in voltage between the top plate and well connection region is measured. In another embodiment, an AC current is applied to the top plate/well connection region combination where the resulting voltage differential is measured. In still another embodiment, circuit 713 implements a balanced bridge method. In some embodiments, a voltage of 0 volts is applied to the top plate and a higher voltage is applied to the well connection region. However, the capacitance of a top plate/well connection region combination may be measured by other methods in other embodiments.

The measured values for each top plate-well connection region are provided via an analog to digital converter (A/D) 717 to processor 719. In one embodiment, the measured capacitance values are provided to processor 719. In other embodiments, processor 719 receives measured values (e.g. voltage, current) and calculates the capacitance values. Each capacitance value is stored in memory 721. In the embodiment shown, after the capacitance for the top plate-well connection region is determined, processor 719 controls multiplexer 711 to couple a different top plate/well connection region to circuit 713 for measuring the capacitance.

When all of the capacitance values for an array are determined, processor 719 uses those values to calculate a directional angle, a horizontal angle, and a dose value of the radiation striking the array. In embodiments where system 701 includes a "dummy array" that does not receive any radiation, processor 719 would use the information from reference capacitance measurements of the dummy array in its calculation of the directional, horizontal, and dose values.

In one embodiment, memory 721 includes a table 722 of entries of normalized capacitance values for the cells of an array. Each entry is associated with a different horizontal angle/directional angle combination. To determine the horizontal angle of radiation striking a sensor array, processor 719 would search table 722 for the entry having capacitance values (e.g. either as a value for each sensor or stored as a differential value of associated sensor pairs) that most closely matches the determined capacitance values. In some embodiments, the determined horizontal and directional angle values from table 722 would be further extrapolated from the table entry values based on the differences between the determined capacitance values and the capacitance values of the table entries.

In other embodiments, processor 719 calculates the horizontal angle, the directional angle, and/or light dose by executing equations (e.g. stored in memory 721) using the determined capacitance values as variables to the equations. Other embodiments may calculate the directional, horizontal, and dose values using the measured capacitance values in a different technique and/or circuit.

Circuitry 707 includes an output 762 for providing the horizontal angle, directional angle, and dose value measured to an external source (e.g. a user display or system that uses the data in a control circuit). In one embodiment, processor 719 is part of a control circuit of a device that uses the measured information to control an apparatus (e.g. a solar array).

Circuitry 707 may have other configurations and/or use other components in other embodiments. For example, circuitry 707 may include logic or other types of "hardwired circuitry" for calculating the horizontal and directional values from the measured capacitance values. Furthermore, some of the functions of circuit 713 may be performed by processor 719 in some embodiments.

In some embodiments, circuitry 707 includes calibration circuitry (not shown) for calibrating the capacitance measurements of the array to produce an accurate determination of a horizontal angle, a directional angle, and a dose value. In one example, the calibration circuitry includes fuses for setting the calibration values. In one embodiment, the sensor would be subjected to radiation at predetermined horizontal and directional angles and doses. The capacitance values measured at the angles would be normalized and stored in entries of table 722. In other embodiments, the values would be modifiable by e.g. by trimming.

In some embodiments, circuitry 707 is located on the same integrated circuit as arrays 703, 705, and 708. However in other embodiments, some or all of circuitry 707 is located on different integrated circuits. Also, in some embodiments, each array (703, 705, and 708) may be located on a separate integrated circuit.

In some embodiments, only the directional angle or the horizontal angle would be calculated by circuitry 707. In some embodiments, each capacitive sensor would include its own capacitive measuring circuit (e.g. 713). Also in some embodiments, a system for measuring a component of radiation with a capacitive sensor would include only one capacitive sensor device similar to that of FIG. 4. In another embodiment, a system for measuring a component of radiation with a capacitive sensor would include only one sensor (e.g. one well-top plate structure) with the capacitive measuring circuit coupled to the sensor.

Figure 8:
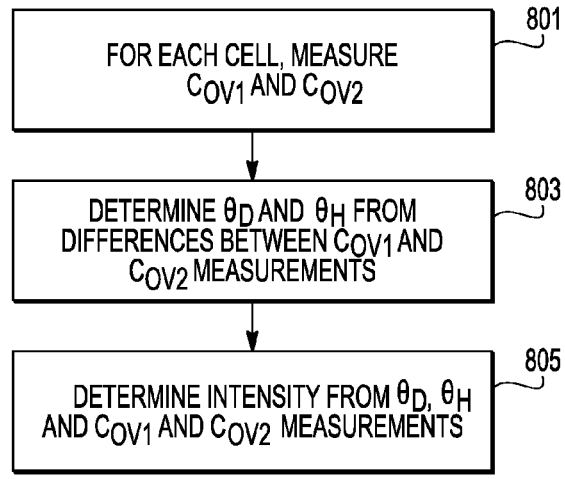
FIG. 8 is a flow diagram setting forth a method of operating a sensor system according to one embodiment of the present invention.

FIG. 8 shows a flow chart for determining the directional angle, the horizontal angle, and the dose of radiation by a system (e.g. similar to system 701). In operation 801, the capacitance values for each sensor of an array (e.g. $C_{OV1}$ and $C_{OV2}$ for the embodiment shown in FIG. 4) are measured. In 803, the differences between those capacitive values of a cell are calculated and used to determine the directional angle and horizontal angle of wavelength radiation striking the cell. In 805, the dose of the radiation is determined by adding the total measured capacitive values of the cells. In some embodiments, the calculation of dose utilizes the horizontal and directional values determined in 803.

In some embodiments, the differences in capacitance between the two sensors of a sensor cell are explicitly calculated (e.g. by a processor). Those difference values are used in the computation of (or in looking up in a table) the horizontal and directional angles. In other embodiments, the values for each sensor are used in an equation or used as table entries to calculate the directional and horizontal angles where the table entries or equations inherently use the differences in capacitance between the sensors of a cell in calculating the directional and horizontal angles.

Figure 10:
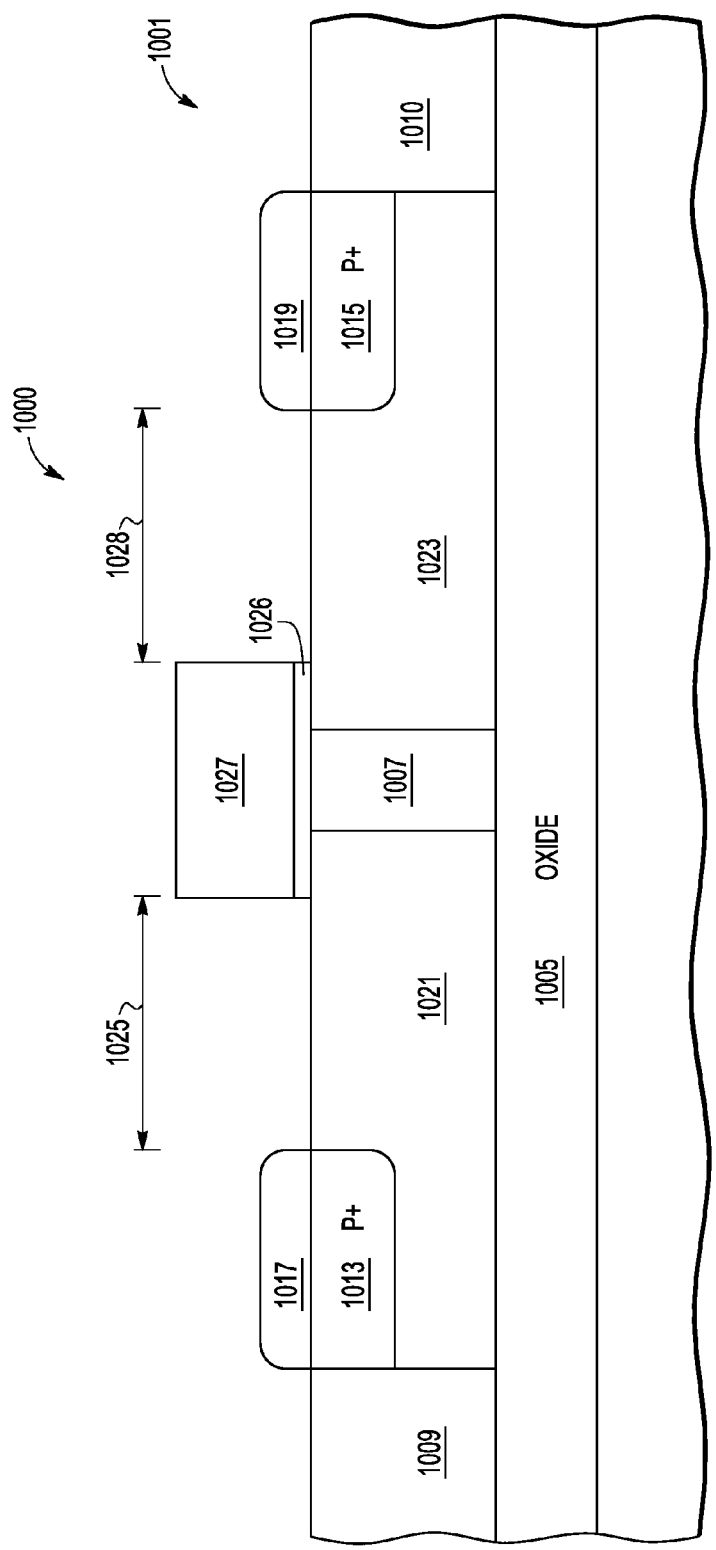
FIG. 10 sets forth a partial cross sectional view of an incident capacitive sensor device according to one embodiment of the present invention.

FIG. 10 is a partial side view of a wafer at a stage in the manufacture of a sensor cell 1000 according to another embodiment of the present invention. Cell 1000 is formed on substrate 1001. Wells 1021 and 1023 are made of a material (e.g. silicon) that forms hole-electron pairs when radiation strikes the material. Wells 1021 and 1023 are located on a buried oxide layer 1005. Well region 1021 is located between isolation regions 1007 and 1009 and well region 1023 is located between isolation regions 1007 and 1010. In one embodiment, the isolation regions are made of an oxide. The connection regions 1013 and 1015 are heavily doped with a P type dopant and the well regions 1021 and 1023 are lightly doped with a P type dopant. Because the connection regions and the wells are doped with the same conductivity type dopants, the well regions are isolated by isolation regions 1009 and 1010 as opposed to being shared with other well regions of other cells. A top plate 1027 is formed on a dielectric layer 1026. Silicide structures 1017 and 1019 are formed on connection regions 1013 and 1015, respectively. The window 1025 for well region 1021 is the space between silicide structure 1017 and top plate 1027 and the window 1028 for well region 1023 is the space between top plate 1027 and silicide structure 1019. The inversion layer electrons are the opposite polarity type as compared to P+ connection regions 1013 and 1015. In one embodiment, the sensor operates like a varactor in an inversion mode, which is not the normal mode. In other embodiments, a negative voltage is applied to the top plate where the sensor operates in an accumulation mode like a normal varactor.

In one embodiment, a capacitive sensor device includes a substrate including a first sensor region and a second sensor region. The first sensor region and the second sensor region are of a material conducive to electron-hole pair generation when being struck by radiation having a parameter value in a range of radiation parameter values. The capacitive sensor device includes a separation region in the substrate located between the first sensor region and the second sensor region. The separation region inhibiting the flow of carriers between the first sensor region and the second sensor region. The device includes a top plate structure located over the substrate. The top plate structure includes a blocking structure that is opaque to radiation having a parameter value in the range. The top plate structure includes an electrically conductive structure and a dielectric layer located between the electrically conductive structure and the substrate. The top plate structure is located over a first portion of the first sensor region and a first portion of the second sensor region. The blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation.

In another embodiment, a method for forming a capacitive sensor comprises forming a first sensor region, a second sensor region, and a separation region. The separation region is located between the first sensor region and the second sensor region. The separation region prevents the flow of carriers between the first sensor region and the second sensor region. The first sensor region and the second sensor region are of a material that is conducive to electron-hole pair generation when being struck by radiation having a parameter value in a range of radiation parameter values. The method includes forming a top plate structure over a first portion of the first sensor region and over a first portion of the second sensor region, wherein the top plate structure includes a blocking structure that is opaque to radiation having a parameter value in the range. The top plate structure includes an electrically conductive structure and a dielectric layer located below the electrically conductive structure. The blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation. The blocking structure is not located over a second portion of the first sensor region and a second portion of the second sensor region.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A capacitive sensor device comprising:
    a substrate including a first sensor region and a second sensor region, the first sensor region and the second sensor region are of a material conducive to electron-hole pair generation when being struck by radiation having a parameter value in a range of radiation parameter values, wherein when the first sensor region is struck by radiation having a parameter value in the range of radiation parameter values during operation, a first inversion layer in the first sensor region acting as a first electrode for a first capacitor is modified by the radiation, wherein when the second sensor region is struck by radiation having a parameter value in the range of radiation parameter values during operation, a second inversion layer in the second sensor region acting as a first electrode for a second capacitor is modified by the radiation;
    a separation region in the substrate located between the first sensor region and the second sensor region, the separation region inhibiting the flow of carriers between the first sensor region and the second sensor region;
    a top plate structure located over the substrate, wherein the top plate structure includes a blocking structure that is opaque to radiation having a parameter value in the range, the top plate structure includes an electrically conductive structure and a dielectric layer located between the electrically conductive structure and the substrate, wherein the top plate structure is located over a first portion of the first sensor region and a first portion of the second sensor region, wherein the electrically conductive structure is located over a portion of both the first sensor region and the second sensor region, the electrically conductive structure includes one or more contiguous electrically conductive layers wherein the one or more contiguous electrically conductive layers serves as a second electrode for both the first capacitor and the second capacitor;
    wherein the blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation.

2. The capacitive sensor device of claim 1 wherein the blocking structure includes the electrically conductive structure.

3. The capacitive sensor device of claim 1 further comprising:
    a first connection region electrically coupled to the first sensor region;
    a second connection region electrically coupled to the second sensor region;
    wherein the material is a semiconductor material that has a net doping concentration of conductivity impurities of a first conductivity type, wherein the first connection region and the second connection region are made of the semiconductor material and have a net doping concentration of conductivity impurities of a second conductivity type which is opposite the first conductivity type;
    wherein a capacitance associated with the first sensor region and conductive structure is measured via the first connection region and a capacitance associated with the second sensor region and conductive structure is measured via the second connection region.

4. The capacitive sensor device of claim 3 further comprising a first silicide structure in electrical contact with the first connection region and a second silicide structure in electrical contact with the second connection region.

5. The capacitive sensor device of claim 1 wherein the top plate structure is located over the separation region.

6. The capacitive sensor device of claim 1 wherein the top plate structure includes a portion that is located over the substrate at a location between the first sensor region and the second sensor region.

7. The capacitive sensor device of claim 1 wherein for at least one angle of incidence where radiation strikes the first sensor region and the second sensor region, the blocking structure is positioned to allow radiation having a parameter value in the range to strike the first sensor region and the second sensor region such that the electron-hole pair generation of the first sensor region equals the electron-hole pair generation of the second sensor region.

8. The capacitive sensor device of claim 1 wherein the radiation is wavelength radiation and the parameter is wavelength size.

9. The capacitive sensor device of claim 1 wherein the radiation is particle radiation and the parameter is at least one of the group consisting of particle size and particle energy.

10. A capacitive sensor array including a plurality of capacitive sensor devices of claim 1 with each capacitive sensor device including the first sensor region and the second sensor region within the substrate.

11. The capacitive sensor device of claim 1 wherein:
    the substrate includes a third sensor region, the third sensor region is of a material conducive to electron-hole pair generation when being struck by radiation having a parameter value in a range of radiation parameter values;
    wherein the top plate structure is located over a first portion of the third sensor region;
    wherein the blocking structure is positioned with respect to the first sensor region, the second sensor region, and the third sensor region to selectively and differentially block radiation having a parameter value in the range from the first sensor region, the second sensor region, and the third sensor region so as to differentially impact electron-hole pair generation of the third sensor region with respect to electron-hole pair generation in the first sensor region and with respect to electron-hole pair generation in the second sensor region at selected angles of incidence of the radiation.

12. The capacitive sensor device of claim 1 wherein:
the first sensor region is associated with a first window that allows radiation having a parameter value in the range to strike the first sensor region;
the second sensor region is associated with a second window that allows radiation having a parameter value in the range to strike the second sensor region;
wherein the first window is located on a first side of the blocking structure and the second window is located on a second side of the blocking structure opposite the first side.

13. A capacitive sensor device comprising:
a substrate including a first sensor region and a second sensor region, the first sensor region and the second sensor region are of a material conducive to electron-hole pair generation when being struck by radiation having a parameter value in a range of radiation parameter values;
a separation region in the substrate located between the first sensor region and the second sensor region, the separation region inhibiting the flow of carriers between the first sensor region and the second sensor region;
a top plate structure located over the substrate, wherein the top plate structure includes a blocking structure that is opaque to radiation having a parameter value in the range, the top plate structure includes an electrically conductive structure and a dielectric layer located between the electrically conductive structure and the substrate, wherein the top plate structure is located over a first portion of the first sensor region and a first portion of the second sensor region;
wherein the blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation;
where the material is a semiconductor material that has a first concentration of conductivity impurities of a first conductivity type, the separation region is made of the same semiconductor material with a second concentration of conductivity impurities of the first conductivity type, where the second concentration is greater than the first concentration.

14. A capacitive sensor device comprising:
a substrate including a first sensor region and a second sensor region, the first sensor region and the second sensor region are of a material conducive to electron-hole pair generation when being struck by radiation having a parameter value in a range of radiation parameter values;
a separation region in the substrate located between the first sensor region and the second sensor region, the separation region inhibiting the flow of carriers between the first sensor region and the second sensor region;
a top plate structure located over the substrate, wherein the top plate structure includes a blocking structure that is opaque to radiation having a parameter value in the range, the top plate structure includes an electrically conductive structure and a dielectric layer located between the electrically conductive structure and the substrate, wherein the top plate structure is located over a first portion of the first sensor region and a first portion of the second sensor region;
wherein the blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation;
wherein the top plate structure has a first portion and a second portion located above the first portion, the second portion has width that is less than a width of the first portion, wherein the first portion is conductive and is translucent to radiation having a parameter value in the range, wherein the second portion is opaque to radiation having a parameter value in the range, wherein the blocking structure includes the second portion.

15. A capacitive sensor array comprising:
a plurality of capacitive sensor devices, wherein each capacitive sensor device comprises:
a substrate including a first sensor region and a second sensor region, the first sensor region and the second sensor region are of a material conducive to electron-hole pair generation when being struck by radiation having a parameter value in a range of radiation parameter values;
a separation region in the substrate located between the first sensor region and the second sensor region, the separation region inhibiting the flow of carriers between the first sensor region and the second sensor region;
a top plate structure located over the substrate, wherein the top plate structure includes a blocking structure that is opaque to radiation having a parameter value in the range, the top plate structure includes an electrically conductive structure and a dielectric layer located between the electrically conductive structure and the substrate, wherein the top plate structure is located over a first portion of the first sensor region and a first portion of the second sensor region;
wherein the blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation;
with each capacitive sensor device including the first sensor region and the second sensor region within the substrate;
wherein each capacitive sensor device of the plurality further comprises:
a first connection region in electrical contact with the first sensor region;
a second connection region in electrical contact with the second sensor region;
wherein the material is a semiconductor material that has a net doping concentration of conductivity impurities of a first conductivity type, wherein the first connection region and the second connection region are made of the semiconductor material and have a net doping concentration of conductivity impurities of a second conductivity type which is opposite the first conductivity type;

wherein capacitance associated with the first sensor region and conductive structure is measured via the first connection region and capacitance associated with the second sensor region and conductive structure is measured via the second connection region;

wherein a first connection region of a first capacitive sensor device of the plurality is shared with a second connection region of an adjacent capacitive sensor device of the plurality of the sensor array.

16. A method for forming a capacitive sensor comprising:
forming a first sensor region, a second sensor region, and a separation region, wherein the separation region is located between the first sensor region and the second sensor region, the separation region preventing the flow of carriers between the first sensor region and the second sensor region, the first sensor region and the second sensor region are of a material that is conducive to electron-hole pair generation when being struck by radiation having a parameter value in a range of radiation parameter values, wherein when the first sensor region is struck by radiation having a parameter value in the range of radiation parameter values during operation, a first inversion layer in the first sensor region acting as a first electrode for a first capacitor is modified by the radiation, wherein when the second sensor region is struck by radiation having a parameter value in the range of radiation parameter values during operation, a second inversion layer in the second sensor region acting as a first electrode for a second capacitor is modified by the radiation;

forming a top plate structure over a first portion of the first sensor region and over a first portion of the second sensor region, wherein the top plate structure includes a blocking structure that is opaque to radiation having a parameter value in the range, the top plate structure includes an electrically conductive structure and a dielectric layer located below the electrically conductive structure, wherein the electrically conductive structure is located over a portion of both the first sensor region and the second sensor region, the electrically conductive structure includes one or more contiguous electrically conductive layers wherein the one or more contiguous electrically conductive layers serves as a second electrode for both the first capacitor and the second capacitor;

wherein the blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation, wherein the blocking structure is not located over a second portion of the first sensor region and a second portion of the second sensor region.

17. The method of claim 16 wherein the forming the top plate structure includes forming the layer of dielectric material over the first sensor region, the second sensor region, and the separation region and forming a layer of electrically conductive material over the dielectric layer and patterning the dielectric layer and the layer of electrically conductive material, wherein the patterning the layer of electrically conductive material forms at least part of the electrically conductive structure.

18. The method of claim 16 wherein the material is a semiconductor material that has a net doping concentration of conductivity impurities of a first conductivity type, the method further comprising:
forming a first connection region in the first sensor region and a second connection region in the second sensor region, wherein the forming includes implanting conductivity dopants of a second conductivity type in the first sensor region at the first connection region and in the second sensor region at the second connection region, wherein the second conductivity type is opposite the first conductivity type.

19. The method of claim 18 further comprising:
forming a first silicide structure in electrical contact with the first connection region and a second silicide structure in electrical contact with the second connection region.

20. The method of claim 16 wherein the first sensor region and the second sensor region are each implemented as well regions of a semiconductor material of a substrate doped with a conductivity dopant.

21. A method for forming a capacitive sensor comprising:
forming a first sensor region, a second sensor region, and a separation region, wherein the separation region is located between the first sensor region and the second sensor region, the separation region preventing the flow of carriers between the first sensor region and the second sensor region, the first sensor region and the second sensor region are of a material that is conducive to electron-hole pair generation when being struck by radiation having a parameter value in a range of radiation parameter values;

forming a top plate structure over a first portion of the first sensor region and over a first portion of the second sensor region, wherein the top plate structure includes a blocking structure that is opaque to radiation having a parameter value in the range, the top plate structure includes an electrically conductive structure and a dielectric layer located below the electrically conductive structure;

wherein the blocking structure is positioned with respect to the first sensor region and the second sensor region to selectively and differentially block radiation having a parameter value in the range from the first sensor region and the second sensor region so as to differentially impact electron-hole pair generation of the first sensor region with respect to electron-hole pair generation in the second sensor region at selected angles of incidence of the radiation, wherein the blocking structure is not located over a second portion of the first sensor region and a second portion of the second sensor region;

wherein the forming the top plate structure includes forming the layer of dielectric material over the first sensor region, the second sensor region, and the separation region and forming a layer of electrically conductive material over the dielectric layer and patterning the dielectric layer and the layer of electrically conductive material, wherein the patterning the layer of electrically conductive material forms at least part of the electrically conductive structure;

wherein:
the forming the top plate structure further includes forming a layer of blocking material over the layer of electrically conductive material, the layer of blocking material is of a material and thickness such that it is opaque to radiation having a parameter value in the range;

the forming the top plate structure further includes patterning the layer of blocking material, wherein the blocking structure has a width that is less than the width of the electrically conductive structure.

* * * * *